310-10 SR
FIP8502 XR 3,416,010
CROSS REFERENCE SEARCH ROOM

United States Patent Office 3,416,010
Patented Dec. 10, 1968

3,416,010
ZERO VOLTAGE COMPENSATING CIRCUITS FOR A HALL GENERATOR

Hans Kuhnlein and Ingeborg Pfreimbter, Nurnberg, Germany, assignors to Siemens Aktiengesellschaft, Erlangen, Germany, a corporation of Germany
Filed Sept. 21, 1965, Ser. No. 488,910
Claims priority, application Germany, Sept. 26, 1964, S 93,392
13 Claims. (Cl. 307—309)

The present invention relates to compensating circuits for a Hall generator. More particularly, the invention relates to zero voltage compensating circuits for a Hall generator.

The zero voltage causes difficulties in many technical applications of Hall generators. The zero voltage appears between the Hall electrodes when there is a current in the control electrodes although the Hall generator is not affected by an outside magnetic field. The zero voltage essentially comprises the ohmic zero voltage and the Hall voltage produced by the field of the control current in the control electrodes. The ohmic zero voltage may be compensated in known manner by a resistor between a control electrode and a Hall electrode.

The compensation for ohmic zero voltage by a resistor between a control electrode and a Hall electrode does not depend upon the direction of the control current. The zero voltage produced by self-excitation of the Hall generator due to the field of the control current is not dependent upon the direction of the control current and may not always be compensated by appropriate wiring of the control current supply. In such a case, each of the ohmic zero voltage and the self-induced zero voltage may be compensated by circuitry at constant control current. When the direction of the control current changes, however, the magnitude of the zero voltage doubles due to self-excitation of the Hall generator.

The principal object of the present invention is to provide new and improved zero voltage compensating circuits for a Hall generator.

An object of the present invention is to provide zero voltage compensating circuits for a Hall generator which are not dependent upon the direction of the control current.

In accordance with the present invention, a circuit is provided for compensating for zero voltage between the Hall electrodes of a Hall generator having a Hall plate, a pair of Hall electrodes in electrical contact with selected opposite edges of said Hall plate and a pair of control electrodes in electrical contact with the other opposite edges of said Hall plate substantially perpendicular to said selected opposite edges. The Hall generator includes a source of control current for the control electrodes. The circuit of the present invention comprises a diode and an electrical resistor connected in series circuit connection between at least one of said Hall electrodes and at least one of said control electrodes, said diode having a threshold value in the forward direction which is such that the voltage between said one of said Hall electrodes and said one of said control electrodes is greater than said threshold value, and said resistor having a resistance value sufficient to compensate for zero voltage in at least one direction of current in said control electrodes.

In order that the present invention may be readily carried into effect, it will now be described with reference to the accompanying drawing, wherein.

Figure 1:
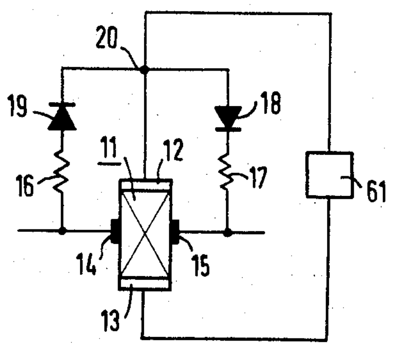
FIG. 1 is a circuit diagram of an embodiment of the zero voltage compensating circuit of the present invention for a Hall generator.

In the embodiment of FIG. 1, both Hall electrodes are connected to the same control electrode. In FIG. 1, a Hall electrode 14 of the Hall generator 11 is connected to a control electrode 12 of said Hall generator via a series circuit connection of a resistor 16 and a diode 19. The other Hall electrode 15 of the Hall generator 11 is connected to the control electrode 12 of said Hall generator via a series circuit connection of a resistor 17 and a diode 18. Both series circuits are connected to the control electrode 12 at a common point 20. The other control electrode 13 of the Hall generator 11 is not connected to either Hall electrode.

If the Hall generator 11 is excited by a positive control current, the control electrode 13 is positive and the zero voltage between the Hall electrodes 14 and 15 is compensated, for example, by the series circuit connection of the resistor 16 and diode 19; the diode 19 being connected with its anode connected to the resistor 16 and its cathode connected to the control electrode 12.

If the control current is reversed, the control electrode 12 is positive and the zero voltage between the Hall electrodes is compensated, for example, by the series circuit connection of the resistor 17 and the diode 18; the diode 18 being connected with its anode connected to the control electrode 12 and its cathode connected to the resistor 17.

Since the part of the zero voltage produced by self-excitation increases as the square of the control current, the zero voltage compensation provided by the compensating circuit applies only to a specific control current. The compensation level must be separately selected for each control current direction. The diodes 18 and 19 must be selected so that the voltage between the common point 20 and each of the Hall electrodes 14 and 15 is greater than the threshold value of said diodes in the forward direction.

Figure 2:
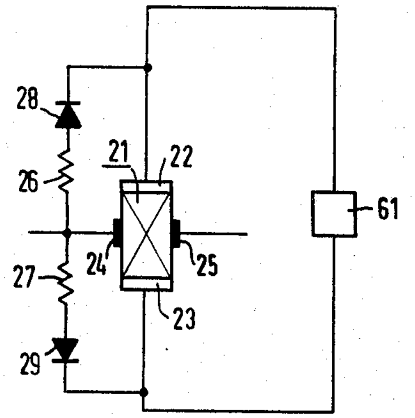
FIG. 2 is a circuit diagram of another embodiment of the zero voltage compensating circuit of the present invention for a Hall generator.

In the embodiment of FIG. 2, both control electrodes are connected to the same Hall electrode. In FIG. 2, a Hall electrode 24 of the Hall generator 21 is connected to a control electrode 22 of said Hall generator via a series circuit connection of a resistor 26 and a diode 28. The same Hall electrode 24 of the Hall generator 21 is connected to the other control electrode 23 of said Hall generator via a series circuit connection of a resistor 27 and a diode 29. The other Hall electrode 25 of the Hall generator 21 is not connected to either control electrode.

In the embodiment of FIG. 2, when the control electrode 22 is positive, the zero voltage between the Hall electrodes 24 and 25 is compensated by the series circuit connection of the resistor 27 and diode 29; the diode 29 being connected with its anode connected to the resistor 27 and its cathode connected to the control electrode 23. When the control electrode 23 is positive, the zero voltage between the Hall electrodes is compensated by the series circuit connection of the resistor 26 and diode 28; the diode 28 being connected with its anode connected to the resistor 26 and its cathode connected to the control electrode 22.

Figure 3:
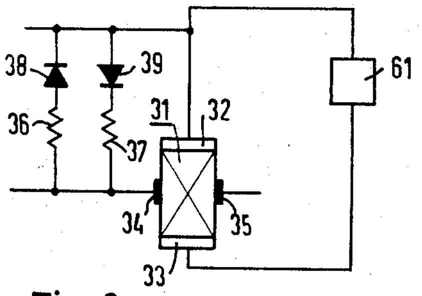
FIG. 3 is a circuit diagram of still another embodiment of the zero voltage compensating circuit of the present invention for a Hall generator.

In the embodiment of FIG. 3, one control electrode is connected to one Hall electrode. In FIG. 3, a Hall electrode 34 of the Hall generator 31 is connected to a control electrode 32 of said Hall generator via a first series circuit connection of a resistor 37 and a diode 39 and a second series circuit connection of a resistor 36 and a diode 38, the first and second series circuit connections being connected in parallel with each other. The other Hall electrode 35 of the Hall generator 31 is not connected to either control electrode and the other control electrode 33 of said Hall generator is not connected to either Hall electrode.

In the embodiment of FIG. 3, when the control electrode 32 is positive, the zero voltage between the Hall electrodes 34 and 35 is compensated by the first series circuit connection of the resistor 37 and diode 39; the diode 39 being connected with its anode connected to the control electrode 32 and its cathode connected to the resistor 37. When the control electrode 33 is positive, the zero voltage between the Hall electrodes is compensated by the second series circuit connection of the resistor 36 and diode 38; the diode 38 being connected with its anode connected to the resistor 36 and its cathode connected to the control electrode 32.

Figure 4:
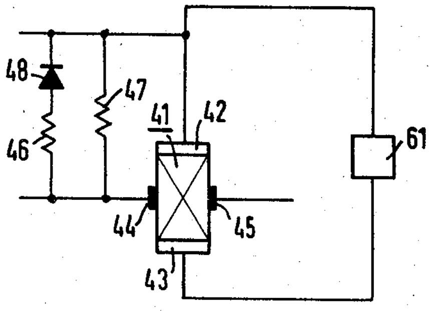
FIG. 4 is a modification of the embodiment of FIG. 3.

In the modification of FIG. 4, the zero compensating circuit is the same as that of the embodiment of FIG. 3 except that the first diode is dispensed with. In FIG. 4, a Hall electrode 44 of the Hall generator 41 is connected to a control electrode 42 of said Hall generator via a resistor 47 and a series circuit connection of a resistor 46 and a diode 48, the resistor 47 being connected in parallel with the series circuit connection 46, 48. The other Hall electrode 45 of the Hall generator 41 is not connected to either control electrode and the other control electrode 43 of said Hall generator is not connected to either Hall electrode.

Figure 5:
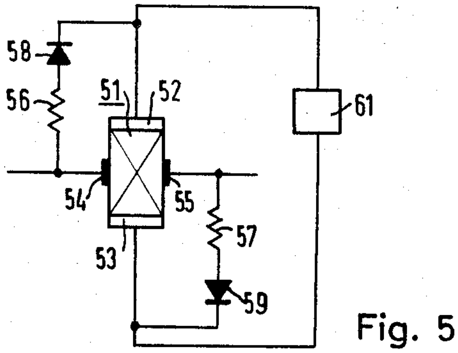
FIG. 5 is a circuit diagram of yet another embodiment of the zero voltage compensating circuit of the present invention for a Hall generator.

In the embodiment of FIG. 5, one control electrode is connected to one Hall electrode and the other control electrode is connected to the other Hall electrode. In FIG. 5, a Hall electrode 54 of the Hall generator 51 is connected to a control electrode 52 of said Hall generator via series circuit connection of a resistor 56 and a diode 58. A Hall electrode 55 of the Hall generator 51 is connected to a control electrode 53 of said Hall generator via a series circuit connection of a resistor 57 and a diode 59.

In the embodiment of FIG. 5, when the control electrode 52 is positive, the zero voltage between the Hall electrodes 54 and 55 is compensated by the series circuit connection of the resistor 57 and diode 59; the diode 59 being connected with its anode connected to the resistor 57 and its cathode connected to the control electrode 53. When the control electrode 53 is positive, the zero voltage between the Hall electrodes is compensated by the series circuit connection of the resistor 56 and the diode 58; the diode 58 being connected with its anode connected to the resistor 56 and its cathode connected to the control electrode 52.

A Hall generator comprising a ferrite plate produces, in a demagnetized condition, a zero voltage of 2.5 millivolts at a control current of +75 milliamperes, and a zero voltage of −3.3 millivolts at a control current of −75 milliamperes. At a control current of +75 milliamperes, the zero voltage may be compensated in known manner such as, for example, by a resistor of 9.5 kilohms resistance connected between the Hall electrode 14 and the control electrode 12 of the Hall generator 11 of FIG. 1. When the control current is changed in polarity, the zero voltage becomes −5.8 millivolts. If the zero voltage is to be compensated for a control current of −75 milliamperes, this may be accomplished by a resistor of 6.5 kilohms resistance connected between the Hall electrode 15 and the control electrode 12 of the Hall generator 11 of FIG. 1. When the polarity of the control current is again changed, the zero voltage is −5.8 millivolts. The zero voltage compensating circuits of the present invention such as, for example, that of FIG. 1, completely compensate for the zero voltage, reducing it to zero, at a control current of ±75 milliamperes. The circuit of FIG. 1 preferably comprises germanium diodes as the diodes 18 and 19 and a 9.5 kilohm resistor 16 and a 6.5 kilohm resistor 17.

A source of electrical energy 61 is connected to the control electrodes of each Hall generator or Hall plate to provide a control current in such control electrodes. Thus, the source of electrical energy 61 supplies a control current to the control electrodes 12 and 13 of the Hall plate 11, the control electrodes 22 and 23 of the Hall plate 21, the control electrodes 32 and 33 of the Hall plate 31, the control electrodes 42 and 43 of the Hall plate 41, and the control electrodes 52 and 53 of the Hall plate 51.

If the Hall generator is operated with alternating control current, the zero voltage contains the fundamental wave, which is the ohmic component of the zero voltage, and the second harmonic, which is the self-excited component of the zero voltage. The fundamental wave may be compensated for, in known manner, by a resistor having an appropriate resistance value, connected between a Hall electrode and a control electrode. The compensating circuit of the present invention substantially reduces the amplitude of the second harmonic.

While the invention has been described by means of specific examples and in specific embodiments, we do not wish to be limited thereto, for obvious modifications will occur to those skilled in the art without departing from the spirit and scope of the invention.

We claim:

1. A circuit for compensating for zero voltage between the Hall electrodes of a Hall generator having a Hall plate, a pair of Hall electrodes in electrical contact with selected opposite edges of said Hall plate and a pair of control electrodes in electrical contact with the other opposite edges of said Hall plate substantially perpendicular to said selected opposite edges, said Hall generator including means for providing a control current in said control electrodes, said circuit comprising electrical resistance means connected between one of said Hall electrodes and one of said control electrodes for each direction of current in said control electrodes, said resistance means having values sufficient to compensate for zero voltage in both directions of current in said control electrodes.

2. A circuit for compensating for zero voltage between the Hall electrodes of a Hall generator having a Hall plate, a pair of Hall electrodes in electrical contact with selected opposite edges of said Hall plate and a pair of control electrodes in electrical contact with the other opposite edges of said Hall plate substantially perpendicular to said selected opposite edges, said Hall generator including means for providing a control current in said control electrodes, said circuit comprising a diode and an electrical resistor connected in series circuit connection between at least one of said Hall electrodes and at least one of said control electrodes, said diode having a threshold value in the forward direction which is such that the voltage between said one of said Hall electrodes and said one of said control electrodes is greater than said threshold value, and said resistor having a resistance value sufficient to compensate for zero voltage in at least one direction of current in said control electrodes.

3. A circuit for compensating for zero voltage between the Hall electrodes of a Hall generator having a Hall plate, a pair of Hall electrodes in electrical contact with selected opposite edges of said Hall plate and a pair of control electrodes in electrical contact with the other opposite edges of said Hall plate substantially perpendicular to said selected opposite edges, said Hall generator including means for providing a control current in said control electrodes, said circuit comprising a first diode and a first electrical resistor connected in a first series circuit connection between one of said Hall electrodes and one of said control electrodes, said first diode having a threshold value in the forward direction which is such that the voltage between said one of said Hall electrodes and said one of said control electrodes is greater than said threshold value and said first resistor having a resistance value sufficient to compensate for zero voltage in one direction of current in said control electrodes, and a second diode and a second electrical resistor connected in a second series circuit connection between the other of said Hall electrodes and said one of said control electrodes, said second diode having a threshold value in the forward direction which is such that the voltage between said other of said Hall electrodes and said one of said control electrodes is greater than said threshold value and said second resistor having a resistance value sufficient to compensate for zero voltage in the other direction of current in said control electrodes.

4. A circuit for compensating for zero voltage between the Hall electrodes of a Hall generator as claimed in claim 3, wherein said first diode is connected to conduct current in said one direction of current and said second diode is connected to conduct current in said other direction of current.

5. A circuit for compensating for zero voltage between Hall electrodes of a Hall generator having a Hall plate, a pair of Hall electrodes in electrical contact with selected opposite edges of said Hall plate and a pair of control electrodes in electrical contact with the other opposite edges of said Hall plate substantially perpendicular to said selected opposite edges, said Hall generator including means for providing a control current in said control electrodes, said circuit comprising a first diode and a first electrical resistor connected in a first series circuit connection between one of said Hall electrodes and one of said control electrodes, said first diode having a threshold value in the forward direction which is such that the voltage between said one of said Hall electrodes and said one of said control electrodes is greater than said threshold value and said first resistor having a resistance value sufficient to compensate for zero voltage in one direction of current in said control electrodes, and a second diode and a second electrical resistor connected in a second series circuit connection between said one of said Hall electrodes and the other of said control electrodes, said second diode having a threshold value in the forward direction which is such that the voltage between said one of said Hall electrodes and said other of said control electrodes is greater than said threshold value and said second resistor having a resistance value sufficient to compensate for zero voltage in the other direction of current in said control electrodes.

6. A circuit for compensating for zero voltage between the Hall electrodes of a Hall generator as claimed in claim 5, wherein said first diode is connected to conduct current in said one direction of current and said second diode is connected to conduct current in said other direction of current.

7. A circuit for compensating for zero voltage between the Hall electrodes of a Hall generator having a Hall plate, a pair of Hall electrodes in electrical contact with selected opposite edges of said Hall plate and a pair of control electrodes in electrical contact with the other opposite edges of said Hall plate substantially perpendicular to said selected opposite edges, said Hall generator including means for providing a control current in said control electrodes, said circuit comprising a first diode and a first electrical resistor connected in a first series circuit connection between one of said Hall electrodes and one of said control electrodes, said first diode having a threshold value in the forward direction which is such that the voltage between said one of said Hall electrodes and said one of said control electrodes is greater than said threshold value and said first resistor having a resistance value sufficient to compensate for zero voltage in one direction of current in said control electrodes, and a second diode and a second electrical resistor connected in a second series circuit connection between said one of said Hall electrodes and said one of said control electrodes, said second diode having a threshold value in the forward direction which is such that the voltage between said one of said Hall electrodes and said one of said control electrodes is greater than said threshold value and said second resistor having a resistance value sufficient to compensate for zero voltage in the other direction of current in said control electrodes.

8. A circuit for compensating for zero voltage between the Hall electrodes of a Hall generator as claimed in claim 7, wherein said first diode is connected to conduct current in said one direction of current and said second diode is connected to conduct current in said other direction of current.

9. A circuit for compensating for zero voltage between the Hall electrodes of a Hall generator as claimed in claim 7, wherein said first and second series circuit connections are connected in parallel with each other.

10. A circuit for compensating for zero voltage between the Hall electrodes of a Hall generator having a Hall plate, a pair of Hall electrodes in electrical contact with selected opposite edges of said Hall plate and a pair of control electrodes in electrical contact with the other opposite edges of said Hall plate substantially perpendicular to said selected opposite edges, said Hall generator including means for providing a control current in said control electrodes, said circuit comprising a first diode and a first electrical resistor connected in a first series circuit connection between one of said Hall electrodes and one of said control electrodes, said first diode having a threshold value in the forward direction which is such that the voltage between said one of said Hall electrodes and said one of said control electrodes is greater than said threshold value and said first resistor having a resistance value sufficient to compensate for zero voltage in one direction of current in said control electrodes, and a second electrical resistor connected between said one of said Hall electrodes and said one of said control electrodes, said second resistor having a resistance value sufficient to compensate for zero voltage in the other direction of current in said control electrodes.

11. A circuit for compensating for zero voltage between the Hall electrodes of a Hall generator as claimed in claim 10, wherein said first series circuit connection and said second resistor are connected in parallel with each other.

12. A circuit for compensating for zero voltage between the Hall electrodes of a Hall generator having a Hall plate, a pair of Hall electrodes in electrical contact with selected opposite edges of said Hall plate and a pair of control electrodes in electrical contact with the other opposite edges of said Hall plate substantially perpendicular to said selected opposite edges, said Hall generator including means for providing a control current in said control electrodes, said circuit comprising a first diode and a first electrical resistor connected in a first series circuit connection between one of said Hall electrodes and one of said control electrodes, said first diode having a threshold value in the forward direction which is such that the voltage between said one of said Hall electrodes and said one of said control electrodes is greater than said threshold value and said first resistor having a resistance value sufficient to compensate for zero voltage in one direction of current in said control electrodes, and a second diode and a second electrical resistor connected in a second series circuit connection between the other of said Hall electrodes and the other of said control electrodes, said second diode having a threshold value in the forward direction which is such that the voltage between said other of said Hall electrodes and said other of said control electrodes is greater than said threshold value and said second resistor having a resistance value sufficient to compensate for zero voltage in the other direction of current in said control electrodes.

13. A circuit for compensating for zero voltage between the Hall electrodes of a Hall generator as claimed in claim 12, wherein said first diode is connected to conduct current in said one direction of current and said second diode is connected to conduct current in said other direction of current.

(References on following page)

References Cited

UNITED STATES PATENTS

| | | | |
|---|---|---|---|
| 3,011,064 | 1961 | Duinker | 324—45 |
| 3,160,823 | 12/1964 | Christensen | 307—88.5 |
| 3,221,261 | 11/1965 | Ertel | 307—88.5 |
| 3,319,173 | 5/1967 | Engel | 307—88.5 |

ARTHUR GAUSS, *Primary Examiner.*

HAROLD A. DIXON, *Assistant Examiner.*

U.S. Cl. X.R.

310—10; 324—45